United States Patent
Ruppi

(10) Patent No.: US 7,192,660 B2
(45) Date of Patent: Mar. 20, 2007

(54) LAYER WITH CONTROLLED GRAIN SIZE AND MORPHOLOGY FOR ENHANCED WEAR RESISTANCE

(75) Inventor: Sakari Ruppi, Fagarsta (SE)

(73) Assignee: Seco Tools AB, Fagersta (SE)

(*) Notice: Subject to any disclaimer, the term of this patent is extended or adjusted under 35 U.S.C. 154(b) by 285 days.

(21) Appl. No.: 10/831,167

(22) Filed: Apr. 26, 2004

(65) Prior Publication Data

US 2005/0013995 A1 Jan. 20, 2005

(30) Foreign Application Priority Data

Apr. 24, 2003 (SE) .................................. 0301196

(51) Int. Cl.
*B32B 9/00* (2006.01)

(52) U.S. Cl. .................... 428/698; 51/307; 51/309; 428/325; 428/336; 428/697; 428/699

(58) Field of Classification Search ................ 428/697, 428/698, 699, 325, 336; 51/307, 309
See application file for complete search history.

(56) References Cited

U.S. PATENT DOCUMENTS

| | | | |
|---|---|---|---|
| RE31,526 E | | 2/1984 | Smith et al. |
| 4,619,866 A | | 10/1986 | Smith et al. |
| 4,619,886 A | | 10/1986 | Okutsu |
| 4,753,854 A | * | 6/1988 | Gavrilov et al. ............. 428/698 |
| 5,863,640 A | * | 1/1999 | Ljungberg et al. .......... 428/701 |
| 5,945,207 A | * | 8/1999 | Kutscher et al. ............. 428/325 |
| 5,981,049 A | * | 11/1999 | Ohara et al. ................. 428/699 |
| 5,981,078 A | * | 11/1999 | Tabersky et al. ............. 428/697 |
| 6,090,476 A | * | 7/2000 | Thysell et al. ............... 428/698 |
| 6,221,469 B1 | | 4/2001 | Ruppi |
| 6,284,356 B1 | * | 9/2001 | Kiriyama ..................... 428/699 |
| 6,333,098 B1 | * | 12/2001 | Olsson et al. ................ 428/697 |
| 6,472,060 B1 | | 10/2002 | Ruppi et al. |

FOREIGN PATENT DOCUMENTS

| | | | |
|---|---|---|---|
| JP | 06-158325 | * | 6/1994 |
| JP | 07-062542 | * | 3/1995 |
| JP | 08-132130 | * | 5/1996 |

* cited by examiner

*Primary Examiner*—Archene Turner
(74) *Attorney, Agent, or Firm*—Drinker Biddle & Reath LLP

(57) ABSTRACT

Wear resistance of the prior-art Ti(C,N) layers can be considerably enhanced by optimizing the grain size and microstructure. Considerably better wear resistance in, for example in many carbon steels, can be obtained by modifying the grain size and morphology of prior art MTCVD Ti(C,N) coatings. The improved coating is composed of small columnar crystals. Doping by using CO, $CO_2$, $ZrCl_4$, $HfCl_4$ and $AlCl_3$ or combinations of these can ensure the control of the grain size and shape. Doping has to be controlled carefully in order maintain the columnar structure and also in order to avoid nanograined structures and oxidization. The preferred grain size should be in the sub-micron region with the grain width of from about 30 to about 300 nm. The length to width ratio should be more than 5, preferably more than 10 and the coating should exhibit a strong preferred growth orientation along 422 or 331. The XRD line broadening should be weak.

15 Claims, 3 Drawing Sheets

LAYER WITH CONTROLLED GRAIN SIZE AND MORPHOLOGY FOR ENHANCED WEAR RESISTANCE

BACKGROUND OF THE INVENTION

The present invention relates to a cutting tool inserts consisting of a substrate at least partially coated with a coating consisting of one or more refractory layers of which at least one layer is a MTCVD-Ti(C,N)-layer composed of grains with grain size just above the nanograined region with columnar grain morphology. As a result the problem with grain boundary sliding at higher temperatures has been reduced and, consequently, wear resistance increased. The inserts are particularly useful in applications involving carbon steels or grey cast irons where wear resistance is important.

Coated bodies used for metal cutting are well known. Typically, the bodies are made of a cemented carbide, cermet or ceramic and the coatings are one or more of a Group VIB metal carbide, nitride, oxide or mixtures thereof. For example, cemented carbides coated with layers of TiC, Ti(C,N), $Al_2O_3$ and TiN are widely used. There are many variations in layer composition and thickness. The layers are applied by various methods such as CVD (chemical vapor deposition), both conducted at normal temperatures of from about 900 to about 1100° C. and MTCVD (medium temperature chemical vapor deposition) conducted at temperatures of from about 700 to about 900° C., and PVD (physical vapor deposition).

CVD TiC coatings are usually composed of equiaxed grains with the grain size being form about 0.5 to about 1.0 microns. CVD TiN as well as MTCVD TiCN coatings are composed of columnar grains with the length of the grains approaching the coating layer thickness. The morphology of CVD coatings can be slightly modified by process adjustments. The MTCVD coatings are, however, very difficult to modify by conventional process adjustments. MTCVD coatings are particularly characterized by the presence of large columnar grains with the length of the crystals approaching the thickness of the coating layer. Ti(C,N) layers produced by using MTCVD are today almost exclusively used instead of CVD TiC or Ti(C,N).

It is well-known that the hardness of polycrystalline materials in general (including coating layers as well) obey the Hall-Petch equation: $H=H°+C/\sqrt{d}$ where H is the hardness of a polycrystalline material, $H°$ is the hardness of a single crystal, C is a material constant (C>0) and d is the grain size. As may be seen from this equation, the hardness of a material can be increased by decreasing the grain size.

This relation is, however, not necessarily correct for hard and brittle materials with limited plasticity. Furthermore, when dealing with nanograined hard materials with extremely fine grain sizes, the fraction of material in grain boundaries is increased and this effect has to be taken into consideration. Consequently, a reverse Hall-Petch dependence has been observed in many studies dealing with nanograined materials. Generally, it is assumed that the relationship is valid for grain sizes down to from about 20 to about 50 nm. At these crystal sizes, mobility and multiplication of dislocations will be severely reduced. The properties of grain boundaries will start to dominate and grain boundary sliding has been suggested to be responsible for the reverse Hall-Petch dependence.

As clear from U.S. Pat. No. 6,472,060, the crater wear resistance is reduced when the grain size is decreased in to the nanograined region even though the room temperature hardness is increased. This is explained by increased amount of grain-boundary sliding. Consequently, when wear resistance is considered there is an optimum grain size region just above the nanograined region for the maximum performance. It is emphasised that the optimum grain shape (morphology) is not the same for all work piece materials and should consequently be controlled for different cutting conditions and work piece materials. In all applications, however, the grain size should be slightly above the nanograined region.

The use of different dopants such as a tetravalent titanium, hafnium and/or zirconium compound in the formation of an $Al_2O_3$ layer to promote the formation of a particular phase is shown in U.S. Reissue Pat. 31,526. Also, the use of a dopant selected from the group consisting of sulphur, selenium, tellurium, phosphorous, arsenic, antimony, bismuth and mixtures thereof to increase the growth rate of $Al_2O_3$ applied by CVD as well as to promote even layers of the coating is disclosed in U.S. Pat. No. 4,619,886. Dopants can also be applied to refine the grain size of MTCVD coatings. The use of CO doping to achieve nanograined MTCVD Ti(C,N) layers is disclosed in U.S. Pat. No. 6,472,060.

U.S. Pat. No. 6,472,060 discloses a method where relatively high amounts of CO, from about 5 to about 10%, preferably from about 7 to about 9% of the total gaseous mixture, are used in MTCVD in order to obtain a grain size of the order of 25 nm or less, preferably 10 nm or less. The CO-doped nanograined MTCVD coatings exhibited increased toughness, however, with reduced crater wear resistance as a consequence.

It has previously been shown (U.S. Pat. No. 6,472,060) that the grain size of MTCVD coatings can be decreased considerably and brought into the nanograined region. These nanocrystalline layers should preferably be applied as outermost layers. The nanocrystalline coatings are harder at room temperature but exhibit grain boundary sliding leading to plastic deformation at higher temperatures (at higher cutting speeds).

Due to the extremely fine grain size of these coatings, the surface smoothness is increased and friction coefficient is reduced. Consequently, nanocrystalline coatings can be used as friction reducing/lubricating layers and should, as mentioned above, deposited on top of the existing coating structure.

There is consequently still need to optimise and control the grain size of MTCVD coatings with respect to the material to be machined.

OBJECTS AND SUMMARY OF THE INVENTION

It is an object of this invention to avoid or alleviate the problems of the prior art by providing a coating layer having a controlled grain size, just above the nanograined region, and controlled morphology. In this case the columnar structure is the preferred embodiment.

According to this invention the grain size of MTCVD Ti(C,N) can be reduced, while simultaneously maintaining the columnar structure. In this way the problems with grain boundary sliding at higher temperatures will be reduced. Thus, the coating according to this invention consists of needle-like columnar crystals.

The fine-grained, columnar structure exhibits less grain boundary sliding than equiaxed coatings of the same grain size do at the same temperature and should be used in carbon steels or grey cast irons where wear resistance is important. Hence, the ideal situation in the above indicated wear resistance demanding applications is to control the deposition process so that the Ti(C,N) layer is composed of fine needle-like (columnar) grains. It has been found possible to control CVD process and the grain size and shape by using texture- and structure-modifying agents (referred to as dopants in this application) in such degree that these structures can be produced industrially.

In one aspect, there is provided a cutting tool insert comprising a substrate of cemented carbide, cermet or ceramic at least partially coated with a coating with a total thickness of from about 10 to about 40 µm of one or more refractory layers of which at least one layer is a MTCVD-Ti(C,N)-layer with a thickness of from about 3 to about 30 µm, said layer being composed of columnar grains with grain width of from about 30 to about 300 nm and having a length-to-width ratio (L/W)>3.

In another aspect, there is provided a method of depositing a MTCVD-Ti(C,N)-layer using known MTCVD-technique, the improvement comprising using a dopant addition in order to obtain a layer composed of columnar grains with grain width of from about 30 to about 300 nm and having a length-to-width ratio (L/W) of >3.

The above mentioned coatings can be used in combination of other CVD materials such as alumina to enhance the performance and wear resistance of the prior-art products.

DETAILED DESCRIPTION OF THE PREFERRED EMBODIMENTS OF THE INVENTION

Figure 1:
FIG. 1 shows the surface morphology of a MTCVD Ti(C,N) coating according to the prior art using SEM at a magnification of 10000 times.

It has surprisingly been found that controlled reduction of the grain size of the MTCVD layers simultaneously maintaining the columnar grain morphology enhances the wear resistance by more than 100% over the prior-art MTCVD coatings in carbon steels and cast iron. Especially important is that crater wear resistance is enhanced with maintained toughness. The coatings according to this invention increase the cutting performance at higher cutting speeds and can be combined with alumina layers to tailor-made a tool for extreme high-speed applications. The process can be performed in a controlled way by using modern CVD reactors from the typical MTCVD temperatures of the order of from about 800 to about 900° C. up to 1000° C.

According to the present invention there is provided a cutting tool insert consisting of a substrate at least partially coated with a coating with a total thickness of from about 10 to about 40 µm, preferably from about 15 to about 25 µm consisting of one or more refractory (or wear-resistant) layers of which at least one layer is a MTCVD-Ti(C,N)-layer with columnar grains with a thickness of from about 3 to to about 30 µm, preferably from about 5 to about 20 µm. The columnar grains should have a width from about 30 to about 300 nm, preferably from about 50 to about 200 nm and most preferably from about 50 to about 100 nm. The L/W ratio (Length/Width) should be higher than 3, preferably higher than 5 and most preferably higher than 10. This kind of coating is consequently composed of fine, needle-like grains and shows clearly enhanced wear resistance. Wear resistance of these coatings may exceed that of the prior art MTCVD Ti(C,N) coating deposited from the $TiCl_4$—$CH_3CN$—$N_2$—$H_2$ system by up to several hundreds of percents.

The said layer can be applied onto an $\alpha$-$Al_2O_3$, $\kappa$-$Al_2O_3$ or $\gamma$-$Al_2O_3$ layer which itself has been deposited on top the said layer.

The fine-grained, columnar morphology can be obtained by using extremely low and controlled levels of CO and/or $ZrCl_4$ or $HfCl_4$ doping. These dopants can be added simultaneously and preferably together with $AlCl_3$. The amount of CO should be from about 0.1 to about 1.0% and most preferably from about 0.2 to about 0.8%. $ZrCl_4$ and $HfCl_4$ should be applied in the range of from about 0.1 to about 0.5%, preferably from about 0.2 to about 0.3% and $AlCl_3$ should be applied in the range of from about 0.5 to about 3.0%, preferably from about 1.0 to about 1.5%. Very low amounts of $CO_2$ can be used. In this case, to avoid equiaxed grain morphology, $CO_2$ should be used with extreme care. $CO_2$ should be less than 0.1%, preferably from about 0.01 to about 0.08% of the total flow with a high $CO/CO_2$ ratio. The $CO/CO_2$ ratio should be higher than 8, preferably higher than 10 and if possible from about 15. The deposition is performed at a temperature of from about 700 to about 1000° C., preferably from about 800 to about 900° C.

In Table 1, the effects of the additions of $ZrCl_4$, $HfCl_4$, $AlCl_3$, CO or $CO_2$ dopants in the $TiCl_4$—$CH_3CN$—$N_2$—$H_2$ system are depicted. The coatings were deposited at 880° C. and at a total pressure of 70 mbar.

TABLE 1

|  | CO | CO$_2$ | AlCl$_3$ | ZrCl$_4$ | HfCl$_4$ |
|---|---|---|---|---|---|
| Columnar | 0.1–1.0% | — | — | — | — |
| Columnar | 0.1–1.0% | — | 1.0–2.0% | — | — |
| Columnar | — | — | — | 0.1–0.5% | — |
| Columnar | 0.1–1.0% | — | — | 0.1–0.5% | — |
| Columnar | — | — | 1.0–2.0% | 0.1–0.5% | — |
| Columnar | 0.1–1% | — | 1.0–2.0% | 0.1–0.5% | — |
| Columnar | — | — | — | — | 0.1–0.5% |
| Columnar | 0.1–1.0% | — | — | — | 0.1–0.5% |
| Equiaxed | 1.5–4.0% | — | — | — | — |
| Equiaxed | — | 0.01–0.08% | — | — | — |
| Equiaxed | — | — | — | 1.5–5.0% | — |
| Equiaxed | 1.5–4.0 | — | 2.5–5.5% | — | — |
| Equiaxed | 1.5–4.0% | 0.1–0.4 | 2.5–5.5% | — | — |
| Equiaxed | 0.5–4.0% | — | — | 1.5–3.5% | — |
| Equiaxed | 0.5–4.0% | 0.1–0.4 | 2.5–5.5% | 1.5–3.5% | — |
| Equiaxed | 0.5–4.0% | — | — | — | 0.1–3.5% |
| Equiaxed | 0.5–4.0% | 0.1–0.4 | — | — | 0.1–3.5% |

According to this invention, it has also been found to be possible to control and obtain a uniform columnar grain size in a coating layer independent on the total thickness of the said coating layer. As clear, for example, from U.S. Pat. No. 6,221,469, the grain size depends on the coating thickness. Especially the prior-art CVD coatings show large variation in grain size: in the near vicinity of the substrate the coating may be composed of sub-micron grains while on top of the coating the grain size may be of the order of several micrometers.

The present invention relates the cutting performance with the growth texture. The growth texture can be described by texture coefficients (TC), which are determined as follows:

$$TC(hkl) = \frac{I(hkl)}{I_o(hkl)} \left\{ \frac{1}{n} \sum \frac{I(hkl)}{I_o(hkl)} \right\}^{-1}$$

where
I(hkl)=intensity of the (hkl) reflection
$I_o$(hkl)=standard intensity according to JCPDS card no 42-1489
n=number of reflections used in the calculation
(hkl) reflections used are: (111), (200), (220), (311), (222), (400), (331), (420), (422), (511).

The texture coefficient for all coatings according to this invention should be as follows: The texture coefficient for 422 (TC(422)) should be higher than 5.0, preferably higher than 6 and most preferably higher than 7 or the texture coefficient for 331 (TC(331)) should be higher than 4, preferably higher than 5 and most preferably higher than 6.

Further, line broadening of the 422 reflection should be less than 2.0 expressed as a relative value, the reference being non-doped prior-art Ti(C,N). Line broadening is defined as $B_n/B_0$, where $B_0$ is the Full Width at Half Maximum (FWHM) of the reference reflection and $B_n$ is the Full Width at Half Maximum (FWHM) of the corresponding reflection of the coating according to this invention. Both are measured from $K_{\alpha 2}$- stripped Gaussian profiles of the 422 reflection.

Line broadening is also a useful means to control that the produced layer has not been brought into the nanograined region manifested by strong line broadening of. Expressed in absolute values (2θ°) the FWHM either (422) or (331) diffraction peaks should be less than 1.5°, preferably less than 1.2° most preferably less than 1.0°.

Chemical compositions of the obtained layers can be described by the following formula $(Ti_xAl_yX_z)(C_uO_wN_v)$, where x, u and v>0 and at least one of y, z and w>0. The compositions of the layers according to this invention should be varied in the following limits: x is from about 0.3 to about 0.8, y is from about 0.0 to about 0.1, z is from about 0.0 to about 0.1, u is from about 0.3 to about 0.9, w is from about 0.0 to about 0.1 and y is from about 0.3 to about 0.6. In the formula $(Ti_xAl_yX_z)(C_uO_wN_v)$ X can be selected from groups 4 to 6. The useful elements are Zr, Hf, Nb, Ta or Mo even though Zr and Hf are used preferably.

The substrate comprises a hard material such as cemented carbide, cermets, ceramics, high speed steel or a superhard material such as cubic boron nitride (CBN) or diamond preferably cemented carbide or CBN. With CBN is herein meant a cutting tool material containing at least 40 vol-% CBN. In a preferred embodiment the substrate is a cemented carbide with or without a binder phase enriched surface zone.

The invention is additionally illustrated in connection with the following Examples, which are to be considered as illustrative of the present invention. It should be understood, however, that the invention is not limited to the specific details of the Examples.

EXAMPLE 1

In this case only CO and $ZrCl_4$ were applied to obtain columnar structures with controlled, reduced, gain size. The following five experimental coatings (referred to as coatings 1, 2, 3, 4 and 5) were produced at a pressure of 70 mbar and at a temperature of 880° C. according to the process data given in Table 2. Compared with the U.S. Pat. No. 6,472,060, considerably lower amounts of doping were used except coating 5, which was produced according to prior art U.S. Pat. No. 6,472,060. In order to achieve fine-grained columnar structure, a maximum amount of CO should be less than 1%, preferably from about 0.1 to about 0.8%. In this example, 0.8% of CO was used (Coating 2). Coating 3 was deposited at CO doping level of 2.5% to obtain equi-axed grain morphology. Coating 4 was deposited using $ZrCl_4$ doping to obtain columnar morphology. Coating 5 was deposited using 8% CO according to U.S. Pat. No. 6,472,060 to obtain a nanograined layer. Coating 1 was deposited according to prior art without any dopant addition and is an example of a typical structure of a MTCVD coating.

Cemented carbide cutting inserts with a composition of 6.0% Co and balance WC (hardness about 1580 HV) were used as substrates in all Examples. The following geometries were used in the cutting tests: SNUN120408 and CNMG120408-M3.

TABLE 2

| | $H_2$ (1/min) | $N_2$ (1/min) | $CH_3CN$ (1/min) | $TiCl_4$ (1/min) | $ZrCl_4$ (%) | $AlCl_3$(%) | $CO_2$(%) | CO(%) |
|---|---|---|---|---|---|---|---|---|
| Coating 1 | balance | 45.5 | 0.55 | 2.1 | 0.0 | 0.0 | 0.0 | 0.0 |
| Coating 2 | balance | 45.5 | 0.55 | 2.1 | 0.0 | 0.0 | 0.0 | 0.8 |
| Coating 3 | balance | 45.5 | 0.55 | 2.1 | 0.0 | 0.0 | 0.0 | 2.5 |
| Coating 4 | balance | 45.5 | 0.55 | 2.1 | 0.5 | 0.0 | 0.0 | 0.0 |
| Coating 5 | balance | 45.5 | 0.55 | 2.1 | 0.0 | 0.0 | 0.0 | 8.0 |

EXAMPLE 2

Figure 2:
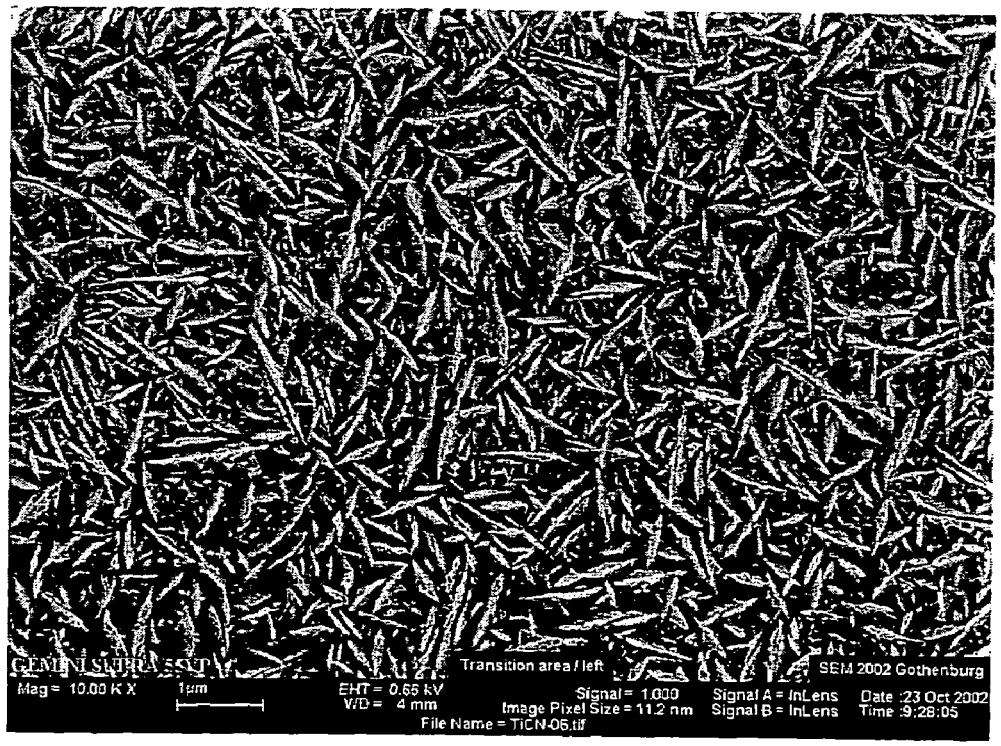
FIG. 2 shows the surface morphology of a modified MTCVD Ti(C,N) coating according to this invention using SEM at a magnification of 10000 times.

The coatings from Example 1 were investigated using Transmission electron microscopy (TEM) and Scanning electron microscopy (SEM) in order to elucidate the effect of CO and $ZrCl_4$ doping on the grain size and morphology. It appeared clear even in SEM that the microstructure of the typical MTCVD Ti(C,N) coating being composed of large columnar crystals (FIG. 1) can be refined by CO doping. The obtained layer was composed of needle like crystals as shown in FIG. 2 at a CO doping level of 0.8%. Similar surface morphologies could be obtained either by $ZrCl_4$ or $HfCl_4$ doping alone or together with CO. The equiaxed grain morphology was obtained at CO doping level of 2.5%. TEM revealed that at this CO level the grain size was not brought into the nanograined region and was about 60 nm. Coating 4, which was deposited using $ZrCl_4$ doping was composed of columnar grains with slightly smaller needle-like grains than Coating 2. The grain size of Coating 5 was in the nanograined region. The results of the coating experiments are summarized in Table 3.

TABLE 3

|  | Grain size*) | Morphology |
|---|---|---|
| Coating 1 | 1500 × 4000 nm | Large columnar |
| Coating 2 | 90 × 650 nm | Needle-like |
| Coating 3 | 60 nm | Small-equiaxed |
| Coating 4 | 75 × 600 nm | Needle-like |
| Coating 5 | 14 nm | Nanograined**) |

*)Measured by TEM;
**)Prior art

EXAMPLE 3

The following five experimental coatings (referred to as coatings 6, 7, 8, 9 and 10) were produced at a pressure of 70 mbar and at a temperature of 880° C. according to the process data given in Table 4. The coating thickness was 8 µm for all coatings. CO2 was not used in this particular example but could be applied with extreme care because coatings can in the presence of this precursor easily be brought into the nanograined region with equiaxed grain size.

Figure 3:
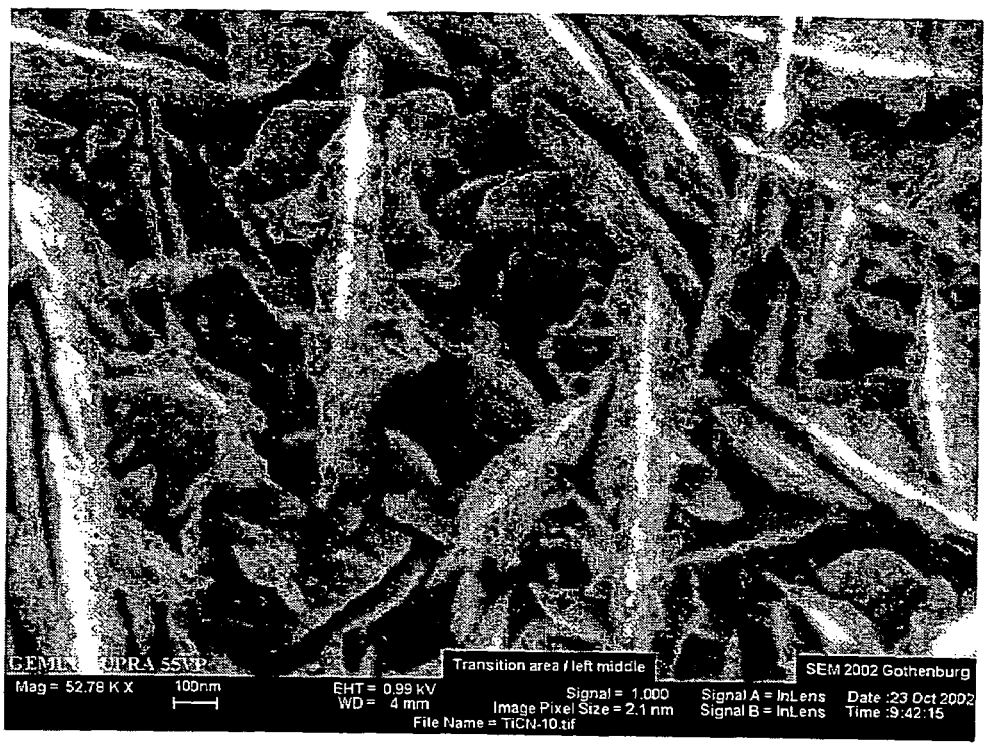
FIG. 3 shows a high resolution FEG SEM image (magnification about 50000 times) of the surface of the coating according to this invention.

The coatings were studied by using TEM together with EDS/WDS. The results are presented in Table 5. Surface morphology of Coating 9 is shown in FIG. 3.

TABLE 4

|  | $H_2$ (l/min) | $N_2$ (l/min) | $CH_3CN$ (l/min) | $TiCl_4$ (l/min) | $ZrCl_4$ (%) | $AlCl_3$(%) | $CO_2$(%) | CO(%) |
|---|---|---|---|---|---|---|---|---|
| Coating 6 | balance | 45.5 | 0.55 | 2.1 | 0.1 | 0.0 | 0.0 | 0.0 |
| Coating 7 | balance | 45.5 | 0.55 | 2.1 | 0.3 | 0.0 | 0.0 | 0.0 |
| Coating 8 | balance | 45.5 | 0.55 | 2.1 | 0.3 | 0.0 | 0.0 | 0.5 |
| Coating 9 | balance | 45.5 | 0.55 | 2.1 | 0.5 | 1.5 | 0.0 | 0.0 |
| Coating 10 | balance | 45.5 | 0.55 | 2.1 | 0.5 | 1.5 | 0.0 | 0.5 |

TABLE 5

|  | Grain size*) | Morphology | Analysis |
|---|---|---|---|
| Coating 6 | 70 × 650 nm | Needle-like | Traces of Zr |
| Coating 7 | 55 × 750 nm | Needle-like | 1.32 wt % Zr |
| Coating 8 | 45 × 820 nm | Needle-like | 1.33 wt % Zr |
| Coating 9 | 75 × 400 nm | Needle-like | 2.11 wt % Zr<br>0.91 wt % Al |
| Coating 10 | 90 × 450 nm | Needle-like | 2.08 wt % Zr<br>1.22 wt % Al |

*)Measured by TEM

EXAMPLE 4

The coatings 1, 2, 3, 4 and 8 were studied using XRD. The texture coefficients were determined according to the following.

$$TC(hkl) = \frac{I(hkl)}{I_o(hkl)}\left\{\frac{1}{n}\sum \frac{I(hkl)}{I_o(hkl)}\right\}^{-1}$$

where
I(hkl)=intensity of the (hkl) reflection
$I_o$(hkl)=standard intensity according to JCPDS card no 42-1489
n=number of reflections used in the calculation
(hkl) reflections used are: (111), (200), (220), (311), (222), (331) (420) (422) (511), the results are given in Table 6.

TABLE 6

| (h, k, l) | Coating 1*) | Coating 2 | Coating 3 | Coating 4 | Coating 8 |
|---|---|---|---|---|---|
| 111 | 1.50 | 0.02 | 0.69 | 0.02 | 0.01 |
| 200 | 0.05 | 0.00 | 0.54 | 0.00 | 0.00 |
| 220 | 0.09 | 0.10 | 0.61 | 0.00 | 0.45 |
| 311 | 0.21 | 0.05 | 0.72 | 0.05 | 0.02 |
| 222 | 0.89 | 0.01 | 0.94 | 0.01 | 0.01 |
| 400 | 0.03 | 0.01 | 0.36 | 0.03 | 0.00 |
| 331 | 1.70 | 0.04 | 1.93 | 0.09 | 7.21 |
| 420 | 0.73 | 0.05 | 1.59 | 0.05 | 0.65 |
| 422 | 3.77 | 9.60 | 1.78 | 9.65 | 1.50 |
| 511 | 1.04 | 0.11 | 0.84 | 0.12 | 0.14 |

*)Prior-art

EXAMPLE 5

Coatings 1, 2, 4 and 8 were studied by using XRD. The grain refinement was slightly manifested as line broadening. XRD demonstrated that the coatings according to this invention are not in the nanograined region, Table 7.

TABLE 7

| CO % | FWHM* (° 2θ) | Line broadening ($B_n/B_0$) | Grain Shape |
|---|---|---|---|
| Coating 1 | 0.541 ($B_0$) | 1.00 | Large columnar**) |
| Coating 2 | 0.849 ($B_{n2}$) | 1.57 | columnar |
| Coating 4 | 0.860 ($B_{n4}$) | 1.59 | columnar |
| Coating 8 | 0.924 ($B_{ng}$) | 1.71 | columnar |

*)Full Width at Half Maximum. Measured from $K_{α2}$-stripped Gaussian profiles of 422 reflection.
**)According to prior-art
Full Width at Half Maximum of the reference is $B_o$.
Full Width at Half Maximum of experimental coating is $B_{n_{coating}}$

EXAMPLE 6

Figure 4:
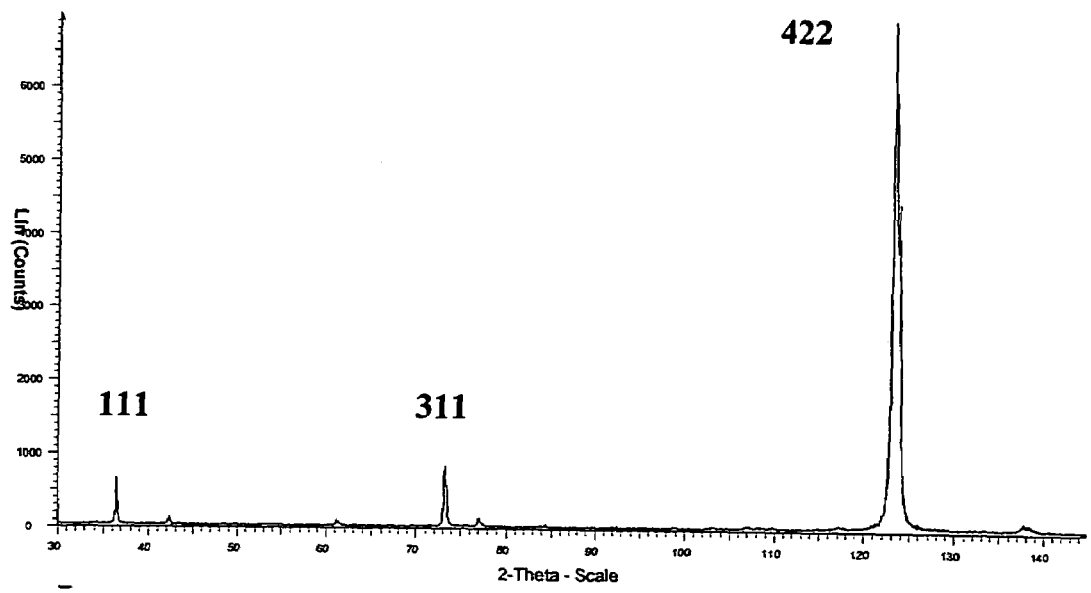
FIG. 4 shows a typical X-ray diffraction pattern of a coating according to this invention being composed of fine, columnar grains.
Figure 5:
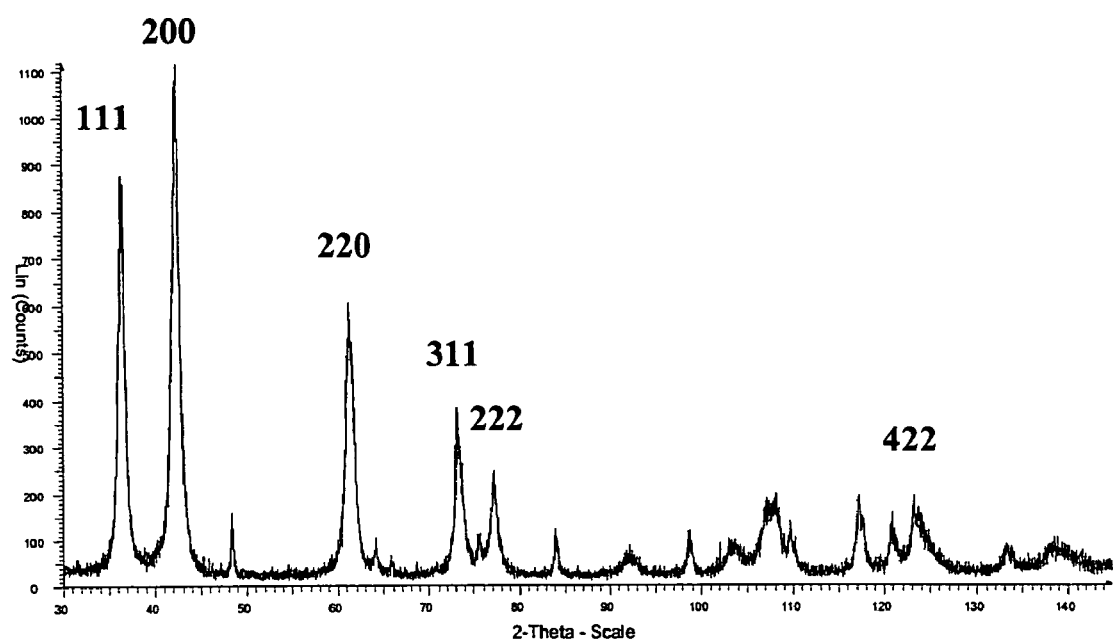
FIG. 5 shows a typical X-ray diffraction pattern of a coating composed of fine, equiaxed grains.

Typical X-ray diffraction patterns originating from Coating 2 (Example 1) and Coating 3 (Example 1) are shown in FIGS. 4 and 5, respectively. Coating 2 (FIG. 4) is deposited according to this invention and is composed of needle-like grains with a strong 422-diffraction peak and Coating 3 (FIG. 5) is composed of small columnar grains. The differences are clear. XRD easily can be used to show that the coating is composed of columnar grains and not of equiaxed grains or visa versa. Further, XRD can be used to verify that the grain size is not brought into the nanograined region.

EXAMPLE 7

The coatings produced in Example 1 were tested in carbon steel under the following conditions:

| | |
|---|---|
| Work piece: | Cylindrical bar |
| Material: | SS1672 |
| Insert type: | SNUN120418 |
| Cutting speed: | 250 and 400 m/min |
| Feed: | 0.5 mm/rev |
| Depth of cut: | 2.5 mm |
| Remarks: | Dry turning |

As can be seen from Table 8 the fine-grained columnar structures exhibited the best wear resistances. It should be noted that all the experimental coatings (also the equiaxed one, Coating 3) showed better wear resistance than the reference. Columnar fine-grained coatings clearly outperformed the prior-art. Zr-doped coating (Coating 4) exhibited the best performance. Nanograined layer (Coating 5) failed due to decreased crater wear resistance especially at the higher cutting speeds.

TABLE 8

Turning Carbon Steel (SS 1672)

| | Life time (min) at 250 m/min | Life time (min) at 400 m/min |
|---|---|---|
| Coating 1*) | 5 | 2 |
| Coating 2 | 9 | 5 |
| Coating 3 | 7 | 3 |
| Coating 4 | 11 | 6 |
| Coating 5*) | 3 | 1 |

Lifetime criterion: crater wear according to ISO 3685
*)Prior art

EXAMPLE 8

The experimental coatings from Examples 1 and 3 were compared in turning of carbon steel under the following conditions:

| | |
|---|---|
| Work piece: | Cylindrical bar |
| Material: | SS1672 |
| Insert type: | CNMG 120418 |
| Cutting speed: | 250 and 400 m/min |
| Feed: | 0.4 mm/rev |
| Depth of cut: | 2.5 mm |
| Remarks: | Dry turning |

TABLE 9

Turning Carbon Steel (SS 1672)

| | Life time (min) at 250 m/min | Life time (min) at 400 m/min |
|---|---|---|
| Coating 1 *) | 5 | 2 |
| Coating 3 | 7 | 3 |
| Coating 6 | 8 | 4 |
| Coating 7 | 11 | 5 |
| Coating 8 | 11 | 5 |
| Coating 9 | 8 | 4 |
| Coating 10 | 9 | 5 |

Lifetime criterion: ISO 3685
*) Prior art

Results are shown in Table 9. All coatings composed of fine-grained columnar crystals outperformed the reference coating (Coating 1) composed of large columnar grains and also the coating composed of equiaxed grains (Coating 3). The coatings 7 and 8 with the highest L/W ratios were found to show the longest tool life.

EXAMPLE 9

The experimental coatings from Examples 1 and 3 were compared in stainless steel (Table 10). All coatings according to this invention exhibited better wear resistance than the reference coating (Coating 1). However, in this material the coating composed of equiaxed grains (Coating 3) exhibited a better performance than the coatings having the columnar structure. Consequently, the columnar coatings should be preferred in carbon steels due to the much better wear resistance under those conditions. In stainless steel one should prefer equiaxed structures.

TABLE 10

Turning Stainless Steel (SS 2333)

| | Life time (min) at 185 m/min | Life time (min) at 250 m/min |
|---|---|---|
| Coating 1 *) | 5 | 2 |
| Coating 3 | 10 | 6 |
| Coating 4 | 8 | 5 |
| Coating 8 | 9 | 4 |
| Coating 9 | 8 | 5 |
| Coating 10 | 9 | 5 |

Lifetime criterion: ISO 3685
*) Prior art

The principles, preferred embodiments, and modes of operation of the present invention have been described in the foregoing specification. The invention, which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. Cutting tool insert comprising a substrate of cemented carbide, cermet or ceramic at least partially coated on a cutting surface with a coating with a total thickness of from about 10 to about 40 μm of one or more refractory layers of which at least one layer is a MTCVD-Ti(C,N)-layer with a thickness of from about 3 to about 30 μm, said layer being composed of columnar grains with grain width of from about 30 to about 300 nm and having a length-to-width ratio (L/W)>3, wherein the at least one MTCVD-Ti(C,N)-layer is applied onto an alumina layer.

2. The cutting tool insert of claim 1 wherein said coating has a total thickness of from about 15 to about 25 μm of one or more refractory layers of which at least one layer is a MTCVD-Ti(C,N)-layer with a thickness of from about 5 to about 20 μm, said layer being composed of columnar grains with grain width of from about 50 to about 200 nm and having a length-to-width ratio (L/W)>5.

3. The cutting tool insert of claim 1 wherein said at least one layer has texture coefficients of a) TC(422)>5 or b) TC(331)>5, wherein the texture coefficient TC(hkl) is defined as $$TC(hkl) = \frac{I(hkl)}{I_o(hkl)} \left\{ \frac{1}{n} \sum \frac{I(hkl)}{I_o(hkl)} \right\}^{-1}$$

where

I(hkl)=measured intensity of the (h kl) reflection
$I_o$(hkl)=standard intensity according to JCPDS card no 42-1489
n=number of reflections used in the calculation
(hkl) reflections used are:(111), (200), (220), (311), (222), (400), (331), (420), (422) and (511).

4. The cutting tool insert of claim 3 wherein said layer has texture coefficients of
a) TC(422)>7
or
b) TC(331)>6,
wherein the texture coefficient TC(hkl) being defined as $$TC(hkl) = \frac{I(hkl)}{I_o(hkl)} \left\{ \frac{1}{n} \sum \frac{I(hkl)}{I_o(hkl)} \right\}^{-1}$$

where

I(hkl)=measured intensity of the (hkl) reflection
$I_o$(hkl)=standard intensity according to JCPDS card no 42-1489
n=number of reflections used in the calculation (hkl) reflections used are: (111), (200), (220), (311), (222), (400), (331), (420), (422) and (511).

5. The cutting tool insert of claim 1 wherein said at least one refractory layer exhibits a line broadening of either (422) or (331) diffraction peaks expressed in absolute values (2θ°) of less than 1.5° using Cu Kα-radiation.

6. The cutting tool insert of claim 5 wherein said refractory layer exhibits a line broadening expressed in absolute values (2θ°) of less than 1.2° using Cu Kα-radiation.

7. The cutting tool insert of claim 6 wherein said refractory layer exhibits a line broadening expressed in absolute values (2θ°) of less than 1.0° using Cu Kα-radiation.

8. The cutting tool insert of claim 1 wherein said MTCVD-Ti(C,N)-layer is a $(Ti_xAl_yX_z)(C_uO_wN_v)$ layer with the following composition: 0.3<x<0.8, 0.0<y<0.1, 0.0<z<0.1, 0.3<u<0.9, 0.0<w<0.1 and 0.3<v<0.6, X being selected from groups 4 to 6.

9. The cutting tool insert of claim 8 wherein in said layer, X is selected from Zr or Hf.

10. The cutting tool insert of claim 1 wherein a second MTCVD-Ti(C,N)-layer deposited below the alumina layer.

11. The cutting tool insert of claim 1 wherein said at least one layer has texture coefficients of
a) TC(422)>5
or
b) TC(331)>4,
wherein the texture coefficient TC(hkl) is defined as $$TC(hkl) = \frac{I(hkl)}{I_o(hkl)} \left\{ \frac{1}{n} \sum \frac{I(hkl)}{I_o(hkl)} \right\}^{-1}$$

where

I(hkl)=measured intensity of the (hkl) reflection
$I_o$(hkl)=standard intensity according to JCPDS card no 42-1489
n=number of reflections used in the calculation
(hkl) reflections used are: (111), (200), (220), (311), (222), (400), (331), (420), (422) and (511).

12. The cutting tool insert of claim 1 wherein said MTCVD-Ti(C,N)-layer is a $(Ti_xAl_yX_z)(C_uO_wN_v)$ layer wherein x, u and v are each greater than zero and at least one of y, z and w is greater than zero and wherein X is selected from groups 4 to 6.

13. The cutting tool insert of claim 1 wherein said alumina layer is an $\alpha$-$Al_2O_3$, $\kappa$-$Al_2O_3$ or $\gamma$-$Al_2O_3$ layer.

14. The cutting tool insert of claim 1 wherein the substrate is cemented carbide.

15. The cutting tool insert of claim 1, wherein the substrate has a binder phase enriched surface zone.

* * * * *